(12) United States Patent
Hoffmuller et al.

(10) Patent No.: US 12,128,704 B2
(45) Date of Patent: Oct. 29, 2024

(54) MASK EXPOSURE METHOD, TRANSPARENT CONDUCTIVE METALLIZATION AND PIGMENT

(71) Applicant: GIESECKE+DEVRIENT CURRENCY TECHNOLOGY GMBH, Munich (DE)

(72) Inventors: Winfried Hoffmuller, Bad Tolz (DE); Michael Sobol, Munich (DE); Andreas Rauch, Ohlstadt (DE)

(73) Assignee: GIESECKE+DEVRIENT CURRENCY TECHNOLOGY GMBH, Munich (DE)

(*) Notice: Subject to any disclaimer, the term of this patent is extended or adjusted under 35 U.S.C. 154(b) by 0 days.

(21) Appl. No.: 18/263,787

(22) PCT Filed: Jan. 10, 2022

(86) PCT No.: PCT/EP2022/025006
§ 371 (c)(1),
(2) Date: Aug. 1, 2023

(87) PCT Pub. No.: WO2022/161737
PCT Pub. Date: Aug. 4, 2022

(65) Prior Publication Data
US 2024/0042788 A1    Feb. 8, 2024

(30) Foreign Application Priority Data
Feb. 1, 2021   (DE) .................... 10 2021 000 478.7

(51) Int. Cl.
*B42D 25/41*    (2014.01)
*B42D 25/373*   (2014.01)
*B42D 25/445*   (2014.01)

(52) U.S. Cl.
CPC .......... *B42D 25/41* (2014.10); *B42D 25/373* (2014.10); *B42D 25/445* (2014.10)

(58) Field of Classification Search
CPC .... B42D 25/41; B42D 25/373; B42D 25/445; H10K 71/621; H10K 71/00
(Continued)

(56) References Cited

U.S. PATENT DOCUMENTS 5,354,099 A   10/1994  Kaule et al.
5,599,047 A   2/1997   Kaule et al.
(Continued)

FOREIGN PATENT DOCUMENTS

DE   4041025 A1   6/1992
EP   0227423 B1   6/1992
(Continued)

OTHER PUBLICATIONS

International Preliminary Report on Patentability from Corresponding PCT Application No. PCT/EP2022/025006, Jul. 31, 2023.
(Continued)

*Primary Examiner* — Justin V Lewis
(74) *Attorney, Agent, or Firm* — Workman Nydegger

(57) ABSTRACT

The invention relates to a mask exposure method comprising the following steps: —the providing of a carrier substrate; the print application of a radiation-crosslinkable washable dye layer to the full area of the carrier substrate; —the exposure of the radiation-crosslinkable washable dye layer in defined regions to radiation by means of a radiation mask, such that the washable dye is cured in the defined regions; —the applying of a metallization over the full area; —the removing of the non-radiation-exposed washable dye outside the defined regions together with the metal present thereon with the aid of a solvent, such that the resultant
(Continued)

carrier substrate has cured washable dye with metal applied thereto only in defined regions.

12 Claims, 3 Drawing Sheets

(58) Field of Classification Search
USPC .......................... 283/67, 72, 94, 95, 96, 98
See application file for complete search history.

(56) References Cited

U.S. PATENT DOCUMENTS

| | | | |
|---|---|---|---|
| 5,803,503 | A | 9/1998 | Kaule et al. |
| 6,318,758 | B1 | 11/2001 | Stenzel et al. |
| 6,454,166 | B1 | 9/2002 | Stenzel et al. |
| 9,244,356 | B1 | 1/2016 | Kobrin et al. |
| 2002/0056758 | A1 | 5/2002 | Stenzel et al. |
| 2016/0238929 | A1* | 8/2016 | Schmidt .................. G03F 7/035 |

FOREIGN PATENT DOCUMENTS

| | | | |
|---|---|---|---|
| EP | 0516790 | A1 | 12/1992 |
| EP | 0848290 | A1 | 6/1998 |
| KR | 20060106873 | A | 10/2006 |
| WO | 9211142 | A1 | 7/1992 |
| WO | 9723357 | A1 | 7/1997 |
| WO | 9913157 | A1 | 3/1999 |
| WO | 2005051675 | A2 | 6/2005 |
| WO | 2010069823 | A1 | 6/2010 |
| WO | 2011064162 | A2 | 6/2011 |
| WO | 2013158543 | A1 | 10/2013 |
| WO | 2013186167 | A2 | 12/2013 |
| WO | 2015049169 | A1 | 4/2015 |
| WO | 2016192858 | A1 | 12/2016 |

OTHER PUBLICATIONS

Kiruthika, S. et al., "Large Area Solution Processed Transparent Conducting Electrode Based on Highly Interconnected Cu Wire Network", Journal of Materials Chemistry C, vol. 2, Mar. 1, 2014, pp. 2089-2094.

Kulkarni et al, "Towards Low Cost Materials and Methods for Transparent Electrodes", Current Opinion in Chemical Engineering, Mar. 27, 2015, pp. 60-68.

Parashkov, R. et al., "Vertical Channel All-Organic Thin-Film Transistors", Applied Physics Letters, American Institute Of Physics, vol. 82, No. 25, Jun. 23, 2003, pp. 4579-4580.

Rao, K.D.M et al., "A Cracked Polymer Templated Metal Network as a Transparent Conducting Electrode for ITO-free Organic Solar Cells", Phys. Chem. Chem. Phys., vol. 16, Jun. 9, 2014, pp. 15107-15110.

German Search Report from corresponding German Patent Application No. DE 102021000478.7, Aug. 30, 2021.

International Search Report from corresponding PCT Application No. PCT/EP2022/025006, Apr. 28, 2022.

* cited by examiner

MASK EXPOSURE METHOD, TRANSPARENT CONDUCTIVE METALLIZATION AND PIGMENT

BACKGROUND

The invention relates to a mask exposure method, to a transparent, conductive metallization, and to a pigment.

Electronic devices, especially semiconductors, solar cells or electrodes, are obtainable, for example by means of the lift-off process which is known in the field of semiconductor fabrication. With the lift-off process, a soluble coating is typically patterned by regional exposure of the soluble coating and its subsequent patterning in a development step. In the literature, techniques for the precision patterning of material applied by vapor deposition are known—see, for example, the text K. D. M. Rao, C. Hunger, R. Gupta, G. U. Kulkarni, M. Thelakkat: "A cracked polymer templated metal network as a transparent conducting electrode for ITO-free organic solar cells", Phys. Chem. Chem. Phys., 2014, Volume 16, pages 15107-15110, and the text S. Kiruthika, R. Gupta, K. D. M. Rao, S. Chakraborty, N. Padmavathy, G. U. Kulkarni: "Large area solution processed transparent conducting electrode based on highly interconnected Cu wire network", J. Mater. Chem. C, 2014, Volume 2, pages 2089-2094.

In accordance with the literature above, a coating is first applied to a foil, and forms numerous cracks as it dries. These cracks form a close-meshed, coherent network. On subsequent application of a material by vapor deposition, the material is deposited not only on (i.e., above) the coating, but also in the cracks. When the coating is removed, by washing with suitable solvents, for example, the material applied above the coating is also removed. The only applied material remaining is that present in the crack lines.

Alternatives for the production of transparent electrodes are given in the article "Towards low-cost transparent conducting electrodes" by Kulkarni et al. in Current opinion in Chemical Engineering, May 2015, 8:60-68.

Described in WO 2016/192858 A1 is an onwardly developed method for the production of an electronic device, based on the concept of employing the technologies known in the field of security element production for documents of value for the precision patterning of metallizations for the provision of electronic devices. The technologies include, among others, the use of a (photo)resist varnish, the employment of an etching medium, and the use of washable ink. In accordance with the method described in WO 2016/192858 A1, a crack-forming coating is applied to a carrier substrate, the crack-forming coating is dried, with the coating on drying forming numerous cracks in the form of a close-meshed, coherent network, and a metallization is applied to the carrier substrate, so that metallic material is deposited on the carrier substrate within the cracks of the crack-endowed coating.

With the production described in WO 2016/192858 A1, the formation of cracks in the crack-forming coating applied prior to metallizing takes place statistically or randomly, and so metallic network structures with random metal line routing and with random network geometry are obtained, depending on the material nature of the crack-forming coating, the drying parameters, and the layer thickness of the crack-forming coating. A targeted metal line routing is not possible with the production method described in WO 2016/192858 A1.

Independently of the description set out above in relation to electronic devices, effect pigments are known in the prior art. Known in particular are what are referred to as color-flop effect pigments, which exhibit a change in color when the viewing angle is changed. They are based, for example, on a multilayer construction such as, for instance, a multilayer $Cr/SiO_2/Al/SiO_2/Cr$ construction or a multilayer $Al/SiO_2/Al/SiO_2/Al$ construction. The central Al layer here acts as a reflector, while the metallic layers at the ends each have the function of an absorber layer; a dielectric spacer layer is present in each case between the reflector and the absorber. Effect pigments of these kinds are generally produced such that the desired multilayer construction is first generated extensively, by means of vapor deposition on a foil, for example. The multilayer construction is subsequently removed from the foil. The removal of the multilayer construction may be made easier if the foil is initially provided with a suitable release layer. The resultant multilayer construction, lastly, is comminuted to give individual pigments. EP 0 227 423 B1, for example, describes the production of an optically variable coating with the steps of providing a flexible web bearing an applied release layer, subsequently applying an optically variable, multilayer interference coating, detaching the interference coating from the flexible web by means of a suitable solvent, and breaking the interference coating into individual pigments.

With the production described above, the detachment of the multilayer construction from the foil takes place in an uncontrolled manner, leading to pigments having a broad size distribution. Furthermore, the grinding of the multilayer construction into pigments leads to fresh, irregular fracture edges and to a fine fraction which is detrimental to the brightness of color and must be separated off from the rest of the mixture. Moreover, a large amount of solvent is needed for the operation.

The present invention is based on the object of improving at least one of the two abovementioned production methods, known in the prior art, for electronic devices or for (effect) pigments.

This object is achieved by the combinations of features defined in the independent claim. Developments of the invention are subjects of the dependent claims.

SUMMARY OF THE INVENTION 1. (First aspect of the invention) A mask exposure method, comprising the following steps:
the provision of a carrier substrate;
the print application of a full-area, radiation-crosslinkable, washable ink layer to the carrier substrate;
the irradiation of the radiation-crosslinkable, washable ink layer in defined regions by means of a shadow mask, so that the washable ink is cured in the defined regions;
the application of a full-area metallization;
the removal of the non-irradiated washable ink outside of the defined regions, together with the metal present thereon, by means of a solvent, so that the carrier substrate obtained is such that only in defined regions it comprises cured washable ink with metal applied thereon.

2. (Preferred configuration) The mask exposure method as set forth in clause 1, wherein the carrier substrate obtained which only in defined regions comprises cured washable ink with metal applied thereon forms a transparent, conductive metallization in the form of a regular, coherent network.

3. (Preferred configuration) The mask exposure method as set forth in clause 1 or 2, wherein the shadow mask is based on a radiation-transparent material which in defined regions comprises a material impervious to the radiation.
4. (Preferred configuration) The mask exposure method as set forth in clause 3, wherein the shadow mask has a cylindrical shape and the radiation-transparent material is selected in particular from glass or quartz.
5. (Preferred configuration) The mask exposure method as set forth in clause 4, wherein the step of irradiating the radiation-crosslinkable, washable ink layer in defined regions by means of the cylindrical shadow mask, so that the washable ink is cured in the defined regions, is carried out such that the web speed of the carrier substrate, present in the form of a substrate web, coincides with the rotary speed of the rotating cylindrical shadow mask.
6. (Preferred configuration) The mask exposure method as set forth in clause 3 as appendant to clause 2, wherein the geometry of the metallization generated in the method, in the form of a regular, coherent network, is determined by a suitable choice of the parameters of the geometric structure of the radiation-impervious shadow mask material and of the spacing of the structures composed of impervious material.
7. (Preferred configuration) The mask exposure method as set forth in any of clauses 1 to 6, wherein the radiation-crosslinkable, washable ink layer is based on a composition which comprises a photoinitiator, a binder and optionally a reactive diluent.
8. (Preferred configuration) The mask exposure method as set forth in clause 7, wherein the binder is a polymer selected from the group consisting of hydroxyethylcellulose, hydroxypropylcellulose, carboxymethylcellulose, polyvinyl alcohol, more particularly of low molecular weight, and of medium degree of hydrolysis, polyvinylpyrrolidone, polyethylene glycol and casein.
9. (Preferred configuration) The mask exposure method as set forth in any of clauses 1 to 8, wherein after the step of the removal of the non-irradiated washable ink outside of the defined regions, together with the metal present thereon, by means of a solvent, the step of isolation of the metal removed takes place, in order thus to obtain platelet-shaped pigments.
10. (Second aspect of the invention) A transparent, conductive metallization in the form of a regular, coherent network, obtainable by the method as set forth in clause 2 or in any of clauses 3 to 8 as appendant to clause 2.
11. (Third aspect of the invention) A platelet-shaped pigment obtainable by the method as set forth in clause 9.

DETAILED DESCRIPTION OF THE INVENTION

The present invention is based on the concept of employing the technology—known in the field of security element production for documents of value—of using a washable ink for the precision patterning of metallizations, in particular for the provision of a transparent, conductive metallization in the form of a regular, coherent network, and also for the provision of platelet-shaped pigments, more particularly effect pigments. The transparent, conductive metallization in the form of a regular, coherent network that is obtainable by the method of the invention can be used in particular as an electronic device.

Security elements having indicia which are visually recognizable in transmitted light, and possibly also in reflected light, are known. The indicia may have any desired forms, such as numbers, letters, patterns, geometric or figurative representations, etc., and are generally referred to, irrespective of their form, as "negative text". The security elements are produced, for example, by providing a transparent substrate with a coating, generally a metallic coating (or metallization), which is then removed again at defined points. If the security element is held against the light, the regions with metallic or other coating appear dark. Conversely, the regions at which the coating has been removed appear light or at least much lighter than the coated regions, depending on the transparency of the substrate. The more transparent a substrate, i.e., the more pervious it is to light, the more pronounced is the contrast between coated and coating-free regions. With very transparent substrates, the negative text is clearly perceptible not only in transmitted light but also in reflected light.

Precision-patterned metallizations may be realized, for example, by what is called a washing process. WO 99/13157 A1 describes a washing process in which a carrier foil is printed with a highly pigmented printing ink in the form of indicia, then coated with a thin masking layer (of aluminum, for example), after which the printing ink together with the masking layer located over it is removed by washing with a liquid in order to generate coating-free regions in the form of the indicia.

WO 92/11142 A1 (corresponding to EP 0 516 790 A1), or its German priority application DE 4 041 025 A1, discloses printing inks which can be activated by heat exposure, examples being waxy emulsions. When these emulsions are heated, they soften, thereby reducing the adhesion to the carrier foil, and so in these poorly adhering regions, assisted by mechanical treatment, such as ultrasound, brushing or rubbing, for example, it is possible to remove not only the softened printing ink but also the layers situated above it. Moreover, activatable printing inks disclosed comprise inks with foaming additives, of the kind customary in the production of foams. These blowing agents give off gas when exposed to heat, and generate foam structures. This increases the volume of the printing ink, so reducing the adhesion on the carrier foil and causing the layers above the printing ink to bulge out, so that they offer a ready point of attack for mechanical removal.

WO 97/23357 A1 refers to EP 0 516 790 A1 and additionally discloses activatable printing inks which are activated—that is, washed off—by treatment with a suitable solvent.

The mask exposure method according to the present invention entails:
the provision of a carrier substrate;
the print application of a full-area, radiation-crosslinkable, washable ink layer to the carrier substrate;
the irradiation of the radiation-crosslinkable, washable ink layer in defined regions by means of a shadow mask, so that the washable ink is cured in the defined regions;
the application of a full-area metallization;
the removal of the non-irradiated washable ink outside of the defined regions, together with the metal present thereon, by means of a solvent, so that the carrier substrate obtained is such that only in defined regions it comprises cured washable ink with metal applied thereon.

The step of washing off harnesses the solubility of the binder present in the washable ink, more particularly a polymer, in the washing medium. The metal deposited on the washable ink regions is removed together with the binder and further particles optionally present in the washable ink, in the washing operation. Left behind is the carrier substrate, on which, in the regions previously not coated with washable ink, the applied metallic network remains largely intact.

The geometry of the metallization generated in accordance with the production method of the invention, in the form of a regular, coherent network, may advantageously be determined through a suitable choice of the parameters of the geometric structure of the radiation-impervious material of the shadow mask and of the spacing of the structures composed of impervious material. The metallic network obtainable by the method of the invention, rather than a statistical or random network structure, instead has a defined metallic network structure with defined metal line width and defined metal line structure. In this way, it is possible to generate metallic network structures with freely selectable transparency and freely selectable electrical conductivity.

In the step of irradiating the radiation-crosslinkable washable ink layer in defined regions by means of a shadow mask, so that the washable ink is cured in the defined regions, UV radiation is advantageously used.

The shadow mask used may at its most simple be a screen which in defined regions has structural elements which are opaque impervious to (UV) radiation—and which may be selected, for example, from a metal or a plastic. Where the carrier substrate is present in the form of a continuous material in roll form, it is useful to provide the shadow mask in the form of a rotating cylindrical body. The cylinder may be based, for example, on a material which is transparent for the (UV) radiation and is selected in particular from glass or quartz. The opaque structural elements, impervious to (UV) radiation, may be made in the transparent material or applied on the transparent material, for example. The cylinder may of course also be based on a screenlike material which is provided with opaque structural elements impervious to (UV) radiation.

Where the step of irradiating the radiation-crosslinkable washable ink layer in defined regions takes place by means of a cylindrical shadow mask, it is useful to carry out the method such that the web speed of the carrier substrate present in the form of a (continuous) substrate web coincides with the rotary speed of the rotating cylindrical shadow mask.

With reference to the binder present in the washable ink, polymers having proven very advantageous for the method of the invention are polymers which have good solubility both in water and in organic solvent, typically alcohols and/or esters. Examples of such binders are hydroxyethylcellulose, hydroxypropylcellulose, carboxymethylcellulose, polyvinyl alcohol, in particular of low molecular weight and of medium degree of hydrolysis, polyvinylpyrrolidone, polyethylene glycol and casein.

The metallic line thicknesses that are attainable at the end of the production method are situated preferably in the range from 1 µm to 50 µm, with the lines generally being so fine that they are perceptible as lines only when a magnifier is used. Viewed over the area, the individual lines are not resolved by the human eye, but a difference relative to the untreated or mere carrier substrate is apparent both in reflected light (or reflection) and in transmitted light (or transmission). By varying the island size, it is possible to adjust the reflection capacity or light transmissibility in a suitable way.

As compared with a conventional, full-area metal layer which is very thin (also called "semitransparent metallization" below), which exhibits a constant optical reflection and transmission, the metallized network structure of the invention is decidedly advantageous in terms of the substantially greater chemical integrity. In the metal lines, the metal is present in the "normal" layer thickness, whereas a conventional semitransparent metallization is very thin and hence susceptible to corrosion, particularly in the case of Al and Cu.

The metallization of the invention in the form of a regular, close-meshed, coherent network exhibits an electrical conductivity and an optical transmission which is comparable with that of a full-area ITO layer. Here, the fine metallic lines may be used in combination with customary embossing varnishes, customary primer compositions and customary heat-sealing varnishes, and function in that context as a reflector.

The carrier substrate which can be used is more particularly a glass substrate, a foil such as a polyethylene terephthalate (PET) foil, for instance, or a multilayer construction.

As and when required, the carrier substrate provided with a metallic network structure may be provided in further regions with a continuous metallization, serving for electrical contacting, for example. It would also be possible to coat the metallic network structure with a metal having a different color from the metal of said structure. In that case, the viewer would see a mixed color. In the course of further processing, additional primer layers and/or heat-sealing varnish layers may be used. Further optical effects as well, such as fluorescence, are readily possible through application of additional effect layers, since the reflector used, i.e., the metallic network structure, is present only over part of the area.

The method for removing the washable ink takes place advantageously by means of dissolution with a suitable solvent. Employed in this context are, for example, water, aqueous solutions, mixtures of solvents and water, optionally with surfactants, optionally with defoamers and other additives. The detachment or dissolution may also be assisted by spray nozzles or else by brushes, rolls or by felts. The choice of solvent is usefully made according to the coating. Typically, as well as water, the following solvents may be used: methyl acetate, ethyl acetate, propyl acetate, butyl acetate, methoxypropyl acetate, acetone, methyl ethyl ketone, methyl isobutyl ketone, cyclopentanone, cyclohexanone, methylene chloride, chloroform, toluene, xylene, methanol, ethanol, 2-propanol. Additionally, acetals or mixtures of the above-stated solvents may be used.

The metallization of the electronic device of the invention may be based on a single metal. An example of a suitable metal is aluminum, silver, copper, nickel, iron, chromium, cobalt, gold, titanium, tin, zinc or an alloy of one or more of the above-stated elements (e.g., an iron-silicon alloy). Furthermore, the metallization may be based on a multilayer metallization, obtainable for example through successive vapor deposition. One advantageous multilayer metallization, for example, is a Cr layer, followed by an Al layer. The adhesion of the Al layer on the layer construction is improved by the Cr layer.

Furthermore, the electrical conductivity of the metallization of the invention in the form of a regular, close-meshed, coherent network may be improved by additional coating with an electrically conductive polymer. An example of a suitable electrically conductive polymer is a thiophene-based electrically conductive polymer such as, for instance, poly-3,4-ethylenedioxythiophene (PEDOT or PEDT). Alternatively, inorganic, transparent and conductive layers may be applied, examples being metal oxides such as titanium dioxide, indium tin oxide or fluorine-tin oxide. These additional layers may also serve for controlled modification of the electrical properties of the metallization of the invention, such as the work function.

The transparent, conductive metallization obtained in the production method of the invention, in the form of a regular, close-meshed, coherent network, may be subsequently removed in certain regions by means of laser radiation (referred to as laser demetallization). In this way, a patterning of the transparent conductive metallization is possible—that is, vacancies or demetallized regions may be provided.

According to a further aspect of the invention, after the step of the removal of the non-irradiated washable ink outside of the defined regions, together with the metal present thereon, by means of a solvent, the step of isolation of the metal removed takes place, in order thus to obtain platelet-shaped (effect) pigments. The platelet-shaped (effect) pigments obtained by the method have a length dimension, for example, in a range from 2 μm to 150 μm.

The reflective coating of the platelet-shaped effect pigments obtained in accordance with the invention may be based at its most simple on a single metallization. Suitable metals are elements such as, for instance, aluminum, stainless steel, nichrome, gold, silver, platinum and copper. Platelet-shaped metal pigments suitable in particular for generating a reflection layer obtainable by printing are known for example from WO 2013/186167 A2, WO 2010/069823 A1, WO 2005/051675 A2 and WO 2011/064162 A2.

The reflective coating of the platelet-shaped effect pigments obtained in accordance with the invention may additionally have a multilayer construction, e.g., an interference layer construction which takes on a different hue according to the viewing angle. An interference layer construction of this kind is based typically on a reflection layer, a partially pervious layer or absorber layer, and a dielectric spacer layer situated in between. The dielectric spacer layer is based, for example, on mica, on $SiO_2$ or on $Al_2O_3$. A preferred example is a multilayer arrangement having the layer sequence of semitransparent absorber layer/dielectric spacer layer/reflection layer, e.g., a multilayer $Cr/SiO_2/Al$ arrangement. Pigments having a thin-layer interference layer construction may also have a five-layer construction such as, for instance, the layer sequence of semitransparent absorber layer/dielectric spacer layer/reflection layer/dielectric spacer layer/semitransparent absorber layer, e.g. a multilayer $Cr/SiO_2/Al/SiO_2/Cr$ arrangement or a multilayer $Al/SiO_2/Al/SiO_2/Al$ arrangement, in which, in the case of the multilayer $Al/SiO_2/AU SiO_2/Al$ arrangement, the central Al layer has a greater layer thickness than each of the two terminal Al layers.

Furthermore, an additional magnetic layer may be generated within the multilayer arrangement, in order thus to provide pigments which can be oriented magnetically.

BRIEF DESCRIPTION OF THE DRAWINGS

Further exemplary embodiments and also advantages of the invention are explained below with reference to the figures, which in order to increase their illustrative nature have not been represented true to scale or to proportion.

DETAILED DESCRIPTION OF VARIOUS EMBODIMENTS

FIGS. 1 to 5 illustrate the production of a transparent conductive metallization of the invention, serving as an electronic device, according to one exemplary embodiment.

Figure 1:
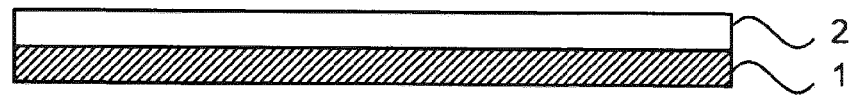
FIGS. 1 to 5 show the production of a transparent conductive metallization of the invention, serving as an electronic device.

In accordance with FIG. 1, a carrier substrate 1 is first provided—a polyethylene terephthalate (PET) foil in the example. Applied by printing on the carrier substrate 1 is a full-area, washable ink layer 2 which is crosslinkable by UV radiation and which in the example is based on the binder polyvinylpyrrolidone, admixed with trimethylolpropane triacrylate with 9-fold ethoxylation (TMP(EO)9TA) as polyfunctional reactive diluent and with a photoinitiator.

Figure 2:
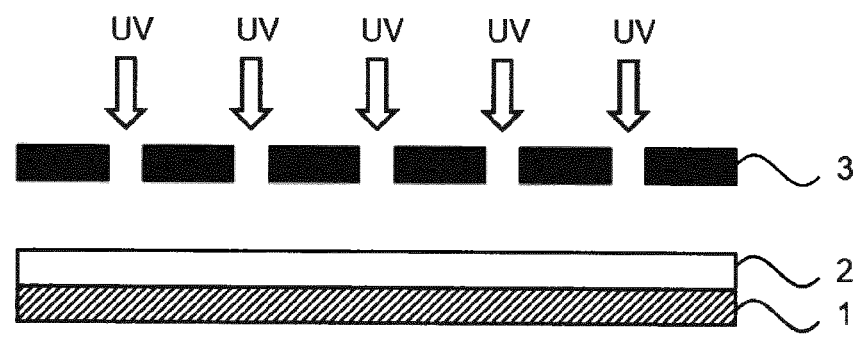

Subsequently, according to FIG. 2, the radiation-crosslinkable, washable ink layer 2 is irradiated in defined regions by means of a shadow mask 3, so that the washable ink is cured in the defined regions.

Figure 3:
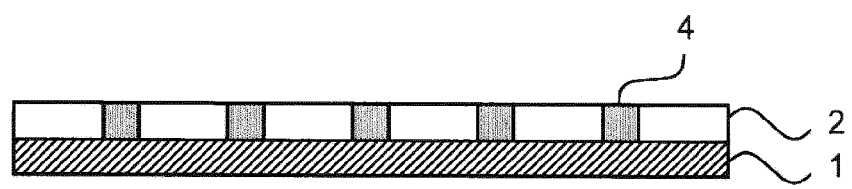

FIG. 3 illustrates the regions 4, cured by means of UV radiation, of the washable ink layer 2 crosslinkable by UV radiation.

Figure 4:
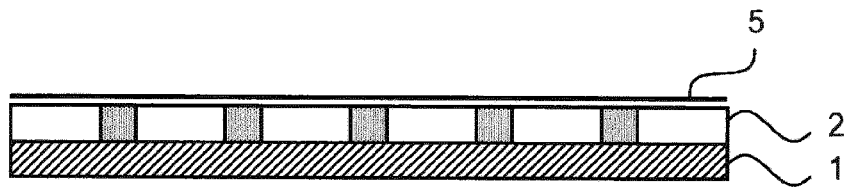
Figure 5:
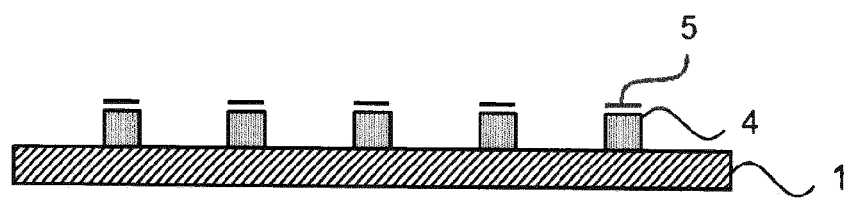

Subsequently, according to FIG. 4, a full-area metallization 5 is applied by vapor deposition—an Ag layer in the example.

The washable ink 2 not irradiated with UV radiation is subsequently removed outside of the defined regions, together with the metal 5 present thereon, by means of a solvent, the carrier substrate 1 obtained being such that only in defined regions it comprises cured washable ink 4 with metal 5 applied thereon. The carrier substrate 1 obtained which only in defined regions comprises cured washable ink 4 with metal 5 applied thereon forms a transparent, conductive metallization in the form of a regular, coherent network.

Figure 6:
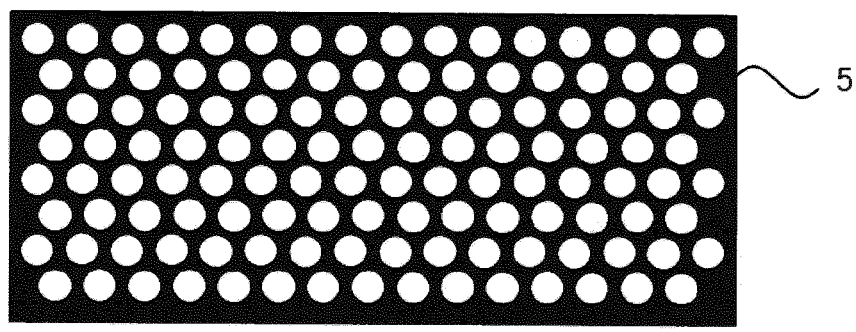
FIG. 6 shows the transparent, conductive metallization of the invention at approximately 25-fold magnification.

FIG. 6 shows the picture of a transparent, conductive metallization of the invention in the form of a regular, coherent network in plan view at about 25 times magnification. Readily apparent are circular regions within the regular, metallic, coherent network 5, these regions taking the form of regular islands. The diameter of one circular region is about 125 μm.

Figure 7:
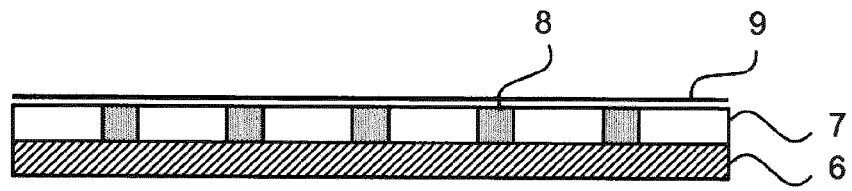
FIGS. 7 and 8 show the production of an (effect) pigment of the invention.
Figure 8:
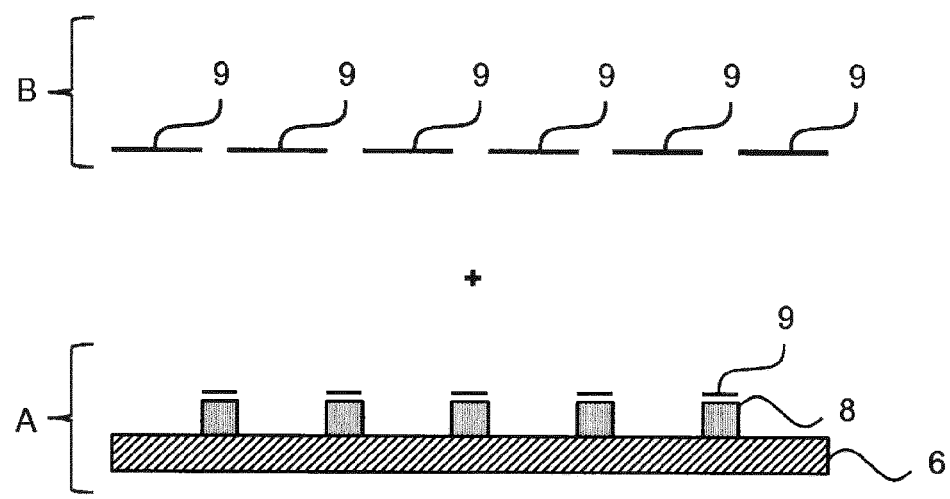

FIGS. 7 and 8 illustrate the production of an (effect) pigment of the invention according to one exemplary embodiment.

In accordance with FIG. 7, a carrier substrate 6 is first provided—a polyethylene terephthalate (PET) foil in the example. Applied by printing on the carrier substrate 6 is a full-area, washable ink layer 7 which is crosslinkable by UV radiation and which in the example is based on the binder polyvinylpyrrolidone, admixed with trimethylolpropane triacrylate with 9-fold ethoxylation (TMP(EO)9TA) as polyfunctional reactive diluent and with a photoinitiator. After the radiation-crosslinkable, washable ink layer 7 has been irradiated in defined regions with UV radiation by means of a shadow mask, the washable ink layer 7 is present in cured form in defined regions 8. This is followed by the application, by vapor deposition, of a color-flopping thin-layer element 9 with reflector/dielectric/absorber construction—in the example, a multilayer $Al/SiO_2/Cr$ arrangement.

Subsequently, according to FIG. 8, the washable ink 7 not irradiated with UV radiation is removed outside of the defined regions 8, together with the thin-layer element 9 present thereon, by washing with a suitable solvent, and so the carrier substrate 6 obtained is such that only in defined regions 8 it comprises cured washable ink with thin-layer element 9 applied thereon (see product "A" in FIG. 8). The platelet-shaped effect pigments 9 are subsequently isolated (see product "B" in FIG. 8).

Figure 9:
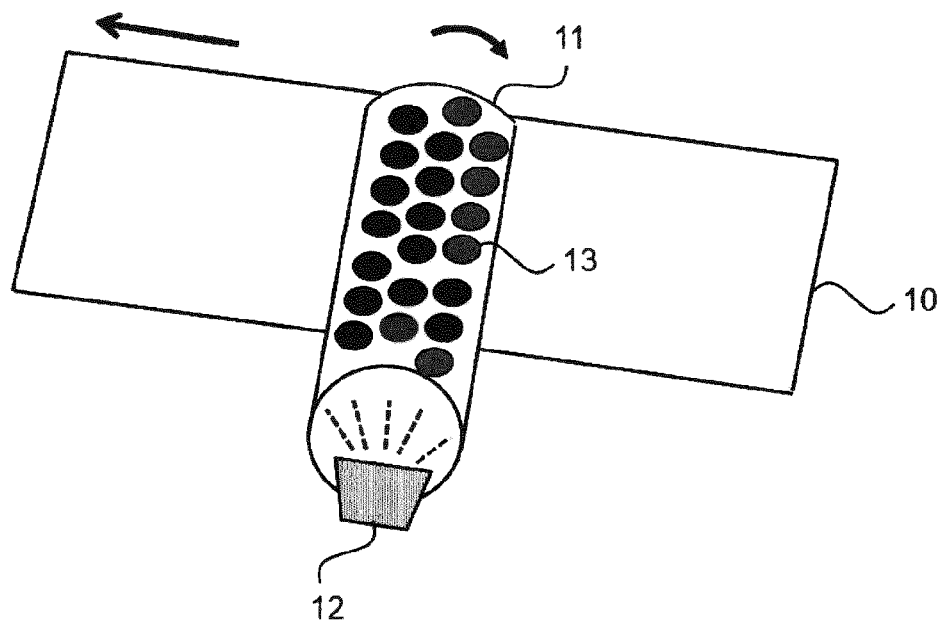
FIG. 9 shows an example of the implementation of the mask exposure of the invention by means of a cylindrical shadow mask.

FIG. 9 illustrates an example of the implementation of the mask exposure of the invention by means of a cylindrical shadow mask 11. The shadow mask 11 is based on a material transparent to UV radiation, quartz in the example. The shadow mask 11 comprises opaque, circular structural elements 13 which are impervious to UV radiation and which in the example are based on a metal. Located at the center of the cylindrical shadow mask 11 is an elongate, rod-shaped UV lamp 12. The length of the UV lamp 12 is such that the carrier substrate 10, present in the form of a continuous web, can be fully irradiated with UV light in the direction perpendicular to the direction of the continuous web. The step of irradiating the radiation-crosslinkable, washable ink layer in defined regions with UV radiation by means of the cylindrical shadow mask 11 takes place such that the web speed of the carrier substrate 10, present in the form of a continuous web, coincides with the rotary speed of the rotating cylindrical shadow mask 11.

The invention claimed is:

1. A mask exposure method, comprising the following steps:
    providing a carrier substrate;
    applying a full-area, radiation-crosslinkable, washable ink layer to the carrier substrate;
    irradiating the radiation-crosslinkable, washable ink layer in defined regions by means of a shadow mask, so that washable ink is cured in the defined regions;
    applying a full-area metallization;
    removing non-irradiated washable ink outside of the defined regions, together with metal present thereon, by means of a solvent, so that the carrier substrate obtained comprises cured washable ink with metal applied thereon only in the defined regions.

2. The mask exposure method according to claim 1, wherein the carrier substrate obtained which only in defined regions comprises cured washable ink with metal applied thereon forms a transparent, conductive metallization in the form of a periodic, coherent network.

3. The mask exposure method according to claim 2, wherein the shadow mask comprises a radiation-transparent material which in defined regions comprises a material impervious to the radiation; wherein a geometry of the metallization generated in the method, in the form of a periodic, coherent network, is determined by choice of parameters of a geometric structure of the radiation-impervious shadow mask material and of spacing of the radiation-impervious shadow mask material.

4. A transparent, conductive metallization in the form of a periodic, coherent network, obtainable by the method according to claim 2.

5. The mask exposure method according to claim 1, wherein the shadow mask comprises a radiation-transparent material which in defined regions comprises a material impervious to the radiation.

6. The mask exposure method according to claim 5, wherein the shadow mask has a cylindrical shape, and the radiation-transparent material comprises glass or quartz.

7. The mask exposure method according to claim 6, wherein the step of irradiating the radiation-crosslinkable, washable ink layer in defined regions by means of the cylindrical shadow mask, so that the washable ink is cured in the defined regions, is carried out such that a web speed of the carrier substrate, present in the form of a substrate web, coincides with a rotary speed of the cylindrical shadow mask.

8. The mask exposure method according to claim 1, wherein the radiation-crosslinkable, washable ink layer comprises a composition which comprises a photoinitiator and a binder.

9. The mask exposure method according to claim 8, wherein the binder is a polymer selected from the group consisting of hydroxyethylcellulose, hydroxypropylcellulose, carboxymethylcellulose, polyvinyl alcohol, polyvinylpyrrolidone, polyethylene glycol and casein.

10. The mask exposure method according to claim 8, wherein the composition of the radiation-crosslinkable, washable ink layer further comprises a reactive diluent.

11. The mask exposure method according to claim 1, wherein after the step of the removal of the non-irradiated washable ink outside of the defined regions, together with the metal present thereon, by means of a solvent, the step of isolation of the metal removed takes place, in order thus to obtain platelet-shaped pigments.

12. A platelet-shaped pigment obtainable by the method according to claim 11.

* * * * *